(12) United States Patent
Watanabe (10) Patent No.: US 10,591,229 B2
(45) Date of Patent: Mar. 17, 2020

(54) THERMALLY CONDUCTIVE SHEET

(71) Applicant: POLYMATECH JAPAN CO., LTD., Saitama (JP)

(72) Inventor: Yasuyoshi Watanabe, Saitama (JP)

(73) Assignee: SEKISUI POLYMATECH CO., LTD., Saitama (JP)

(*) Notice: Subject to any disclaimer, the term of this patent is extended or adjusted under 35 U.S.C. 154(b) by 21 days.

(21) Appl. No.: 15/557,876

(22) PCT Filed: Jun. 14, 2016

(86) PCT No.: PCT/JP2016/067674
§ 371 (c)(1),
(2) Date: Sep. 13, 2017

(87) PCT Pub. No.: WO2016/208458
PCT Pub. Date: Dec. 29, 2016

(65) Prior Publication Data
US 2018/0292148 A1    Oct. 11, 2018

(30) Foreign Application Priority Data
Jun. 25, 2015    (JP) .................................. 2015-127338

(51) Int. Cl.
*B32B 7/02*    (2019.01)
*F28F 21/02*    (2006.01)
(Continued)

(52) U.S. Cl.
CPC ............... *F28F 21/02* (2013.01); *B32B 7/02* (2013.01); *B32B 27/04* (2013.01); *B32B 27/20* (2013.01);
(Continued)

(58) Field of Classification Search
CPC .......... B32B 2264/108; B32B 2305/30; B32B 2307/206; B32B 2307/302;
(Continued)

(56) References Cited

U.S. PATENT DOCUMENTS

2002/0197923 A1* 12/2002 Tobita .................... C09K 5/14
442/74
2003/0129352 A1    7/2003 Takahashi
(Continued)

FOREIGN PATENT DOCUMENTS

| JP | 2001-315244 A | 11/2001 |
| JP | 2003-198166 A | 7/2003 |

(Continued)

OTHER PUBLICATIONS

International Search Report for PCT Patent App. No. PCT/JP2016/067674 (dated Aug. 23, 2016) with English language translation thereof.
(Continued)

*Primary Examiner* — Lawrence D Ferguson
(74) *Attorney, Agent, or Firm* — Cermak Nakajima & McGowan LLP; Tomoko Nakajima (57) ABSTRACT

A thermally conductive sheet is obtained by stacking a carbon fiber oriented thermally conductive layer and an electrically insulating thermally conductive layer, the carbon fiber oriented thermally conductive layer containing a carbon fiber powder, which has a fiber axis oriented in a sheet thickness direction and is contained in a polymer matrix, the electrically insulating thermally conductive layer having a heat conducting property and an electrical insulation property and containing an electrically insulating thermally conductive filler dispersed in a polymer matrix. This thermally conductive sheet has both a high heat conducting property
(Continued)

and an electrical insulating property, is easy to be fixed to an object to be attached, and has excellent handleability.

10 Claims, 2 Drawing Sheets

(51) Int. Cl.
| | | |
|---|---|---|
| *B32B 27/20* | (2006.01) | |
| *B32B 27/04* | (2006.01) | |
| *H01L 23/42* | (2006.01) | |
| *H01L 23/373* | (2006.01) | |
| *H01B 5/14* | (2006.01) | |
| *H01B 1/04* | (2006.01) | |
| *H01B 3/46* | (2006.01) | |

(52) U.S. Cl.
CPC ............ *H01B 5/14* (2013.01); *H01L 23/373* (2013.01); *H01L 23/3737* (2013.01); *H01L 23/42* (2013.01); *B32B 2264/108* (2013.01); *B32B 2305/30* (2013.01); *B32B 2307/206* (2013.01); *B32B 2307/302* (2013.01); *B32B 2307/514* (2013.01); *F28F 2255/06* (2013.01); *H01B 1/04* (2013.01); *H01B 3/46* (2013.01)

(58) Field of Classification Search
CPC ... B32B 2307/514; B32B 27/04; B32B 27/20; B32B 7/02; F28F 21/02; F28F 2255/06; H01B 1/04; H01B 3/46; H01B 5/14; H01L 23/373; H01L 23/3737; H01L 23/42
See application file for complete search history.

(56) References Cited

U.S. PATENT DOCUMENTS

| | | |
|---|---|---|
| 2005/0022966 A1 | 2/2005 | Takahashi |
| 2005/0101719 A1 | 5/2005 | Ishihara |
| 2007/0284366 A1 | 12/2007 | Ohta |
| 2010/0073882 A1* | 3/2010 | Yoshikawa ............... C09K 5/14 |
| | | 361/707 |

FOREIGN PATENT DOCUMENTS

| | | |
|---|---|---|
| JP | 2005-56837 A | 3/2005 |
| JP | 2005-146057 A | 6/2005 |
| JP | 2007-326976 A | 12/2007 |
| JP | 2011-082423 A | 4/2011 |
| JP | 2011-165792 A | 8/2011 |
| JP | 2013-199103 A | 10/2013 |

OTHER PUBLICATIONS

Written Opinion for PCT Patent App. No. PCT/JP2016/067674 (dated Aug. 23, 2016).

* cited by examiner

THERMALLY CONDUCTIVE SHEET

This application is a national phase entry under 35 U.S.C. § 371 of PCT Patent Application No. PCT/JP2016/067674, filed on Jun. 14, 2016, which claims priority under 35 U.S.C. § 119 to Japanese Patent Application No. 2015-127338, filed Jun. 25, 2015, both of which are incorporated by reference.

TECHNICAL FIELD

The present invention relates to a thermally conductive sheet placed between a heat generating element and a heat dissipating element and used.

BACKGROUND ART

In electronic devices used in computers, automobile parts, etc., heat dissipating elements such as heat sinks for dissipating heat generated from heat generating elements such as semiconductor devices, mechanical parts, etc., are used. For the purpose of enhancing the heat transfer efficiency to the heat dissipating elements, thermally conductive sheets are sometimes placed between heat generating elements and heat dissipating elements. For example, as such a thermally conductive sheet, Japanese Unexamined Patent Application Publication No. 2005-146057 (PTL 1) discloses a thermally conductive sheet in which carbon fibers are added as a heat transfer material and are oriented.

Such a thermally conductive sheet in which carbon fibers are oriented has a high heat conducting property in the thickness direction; however, since the carbon fibers have an electrically conductive property, the thermally conductive sheet cannot be applied to usage that requires a high electrical insulating property. To address this issue, Japanese Unexamined Patent Application Publication No. 2001-315244 (PTL 2) discloses a thermally conductive sheet in which an electrically insulating layer formed of an electrical insulating layer-forming composition is formed on one surface of a thermally conductive sheet in which carbon fibers are added as a heat transfer material and oriented.

CITATION LIST

Patent Literature

PTL 1: Japanese Unexamined Patent Application Publication No. 2005-146057
PTL 2: Japanese Unexamined Patent Application Publication No. 2001-315244

SUMMARY OF INVENTION

Technical Problem

However, the heat conducting property of the above-mentioned thermally conductive sheet in which the electrically insulating layer is formed on the thermally conductive sheet in which carbon fibers are oriented is significantly impaired compared to a thermally conductive sheet not equipped with an electrically insulating layer, and thus, there is a problem in that it is difficult to adapt the thermally conductive sheet in usage that requires a high heat conducting property. Moreover, there has been another problem of poor handleability because the hardened electrically insulating layer has a hard surface and is difficult to fix to an object to be attached.

The present invention has been made in view of the problems described above and aims to provide a thermally conductive sheet that has a high heat conducting property as well as an electrical insulating property. The present invention also aims to provide a thermally conductive sheet that has excellent handleability.

Solution to Problem

A thermally conductive sheet according to the present invention that achieves the object described above is configured as follows.

That is, the thermally conductive sheet is obtained by stacking a carbon fiber oriented thermally conductive layer and an electrically insulating thermally conductive layer, the carbon fiber oriented thermally conductive layer containing a carbon fiber powder, which has a fiber axis oriented in a sheet thickness direction and is contained in a polymer matrix, the electrically insulating thermally conductive layer having a heat conducting property and an electrical insulating property and containing an electrically insulating thermally conductive filler dispersed in a polymer matrix.

Since the carbon fiber oriented thermally conductive layer containing a carbon fiber powder having a fiber axis oriented in the sheet thickness direction and being contained in a polymer matrix is provided, the heat conducting property is excellent in the sheet thickness direction but heat is rarely transferred in a sheet side surface direction; thus, excellent anisotropy of the heat conducting property is exhibited.

Compared to a thermally conductive sheet in which flake graphite powder is oriented and which exhibits a heat conducting property not limited in one direction but in directions in which the surfaces of the flake graphite particles spread, the heat conducting property in the axis direction of the fiber axis but not in the surface directions can be enhanced when a carbon fiber powder is used. Thus, heat transfer in directions other than the fiber axis direction can be suppressed.

When a flake graphite powder is used, the surfaces of the flake graphite powder overlap each other and the probability of the graphite particles coming into contact with one another is high, which has been a cause for an increase in electrical conductivity. Meanwhile, when a carbon fiber powder is used, the probability of particles of the carbon fiber powder coming into contact with one another is low, but rather they contact one another with a thermally conductive filler therebetween. Thus, electrical conductivity is characteristically low.

Since the electrically insulating thermally conductive filler is dispersed in the polymer matrix and the electrically insulating thermally conductive layer that has a heat conducting property and an electrical insulating property is provided, the electrical insulating property can be enhanced without significantly degrading the heat conducting property compared to a thermally conductive sheet solely formed of a carbon fiber oriented thermally conductive layer. Thus, the sheet is suitable for usage that requires a high electrical insulating property.

The polymer matrix may be formed of a cured body of a main agent and a curing agent of a liquid silicone.

When the thermally conductive sheet is configured such that the polymer matrix is formed of a cured body of a main agent and a curing agent of a liquid silicone, the viscosity at the stage of a polymer composition before being cured into a polymer matrix is suppressed low, and thus the carbon fiber powder and the thermally conductive filler can be easily added. Thus, a highly oriented thermally conductive sheet can be obtained.

The thermally conductive sheet may be configured such that the value (also known as "E-hardness") of the carbon fiber oriented thermally conductive layer measured by a type E durometer in accordance with Japanese Industrial Standards, JIS K 6253, is 5 to 60 and that the electrically insulating thermally conductive layer is harder than the carbon fiber oriented thermally conductive layer and has an E-hardness of 70 or less and a thickness of 0.15 to 1.5 mm.

Since the E-hardness of the carbon fiber oriented thermally conductive layer measured by a type E durometer in accordance with Japanese Industrial Standards, JIS K 6253, is 5 to 60, the sheet has excellent compressibility and can be closely adhered to an object to be attached; thus, thermal resistance can be suppressed low and a high heat conducting property can be yielded. Since the electrically insulating thermally conductive layer is harder than the carbon fiber oriented thermally conductive layer, the electrically insulating thermally conductive layer is not excessively compressed during compression, and easily maintains an electrical insulating property. Since the hardness of the electrically insulating thermally conductive layer in terms of E-hardness is 70 or less, adhesion to an object to be attached is excellent, and deterioration of the adhesion that results in deterioration of the heat conducting property that occurs when the hardness is excessively large rarely occurs. Since the thickness of the electrically insulating thermally conductive layer is 0.15 to 1.5 mm, pinholes that occur when the thickness is excessively small are suppressed, and heat transfer inhibition that occurs when the thickness is excessively large rarely occurs.

The hardness of the electrically insulating thermally conductive layer in terms of E-hardness can be adjusted to 20 or more.

As long as the hardness of the electrically insulating thermally conductive layer is 20 or more in terms of E-hardness, the electrically insulating thermally conductive layer is not excessively compressed during compression, and the electrical insulating property of the thermally conductive sheet is stabilized. Since the upper limit of the hardness in terms of E-hardness is 70 or less, thermal resistance can be decreased while keeping the flexibility that follows the object to be attached.

The thermally conductive sheet may be configured so that the thermal conductivity of the carbon fiber oriented thermally conductive layer in the sheet thickness direction is 7 W/m·K or more and 30 W/m·K or less and that the thermal conductivity of the electrically insulating thermally conductive layer is 2 W/m·K or more and less than 7 W/m·K.

Since the carbon fiber oriented thermally conductive layer has a thermal conductivity of 7 W/m·K or more and 30 W/m·K or less and the electrically insulating thermally conductive layer has a thermal conductivity of 2 W/m·K or more and less than 7 W/m·K, the thermal conductivity of the thermally conductive sheet can be adjusted to a value close to the thermal conductivity of the carbon fiber oriented thermally conductive layer. Thus, the decrease in thermal conductivity of the thermally conductive sheet caused by adding the electrically insulating thermally conductive layer can be suppressed low.

The thermal conductivity of the electrically insulating thermally conductive layer is preferably 5 W/m·K or more.

When the thermal conductivity is 5 W/m·K or more, the decrease in thermal conductivity of the thermally conductive sheet can be suppressed and a high heat conducting property can be maintained even when the thickness of the electrically insulating thermally conductive layer is increased to about 1.5 mm.

The thermally conductive sheet can be configured so that the thermal conductivity (W) (unit: W/m·K) and the thickness (T) (unit: mm) of the electrically insulating thermally conductive layer satisfy the relationship represented by the following formula (1):

$$0 < T \leq 0.20\ W - 0.19 \qquad \text{formula (1)}$$

When the thermal conductivity (W) and the thickness (T) of the electrically insulating thermally conductive layer satisfy formula (1), a thermally conductive sheet having a high thermal conductivity can be obtained.

The electrically insulating thermally conductive layer can be made thinner than the carbon fiber oriented thermally conductive layer.

When the electrically insulating thermally conductive layer is thinner, the decrease in thermal conductivity of the thermally conductive sheet can be suppressed. Moreover, the carbon fiber oriented thermally conductive layer, which becomes relatively thick, can be unfailingly compressed, and the thermal resistance can be decreased.

The carbon fiber oriented thermally conductive layer may contain a thermally conductive filler having an aspect ratio of 2 or less.

When the carbon fiber oriented thermally conductive layer contains a thermally conductive filler having an aspect ratio of 2 or less, the carbon fiber powder and the thermally conductive filler other than the carbon fiber powder can both be added in larger amounts compared to when the carbon fiber powder alone is added. Thus, a high heat conducting property can be obtained.

Advantageous Effects of Invention

The thermally conductive sheet according to the present invention is a thermally conductive sheet that has both a high heat conducting property and an electrical insulating property. The thermally conductive sheet according to the present invention is easy to fix to an object to be attached and has excellent handleability.

DESCRIPTION OF EMBODIMENTS

Detailed description will now be provided through embodiments. In the embodiments, description for the same material, composition, production method, actions, effects, and the like are not repeated.

First Embodiment

A thermally conductive sheet according to a first embodiment has a structure in which a carbon fiber oriented thermally conductive layer and an electrically insulating thermally conductive layer that are formed into a sheet shape are stacked.

<Carbon Fiber Oriented Thermally Conductive Layer>

The carbon fiber oriented thermally conductive layer is a layer obtained by curing a mixed composition, which is prepared by blending a carbon fiber powder and a thermally conductive filler other than the carbon fiber powder into a liquid polymer composition that forms a polymer matrix, into a sheet shape. The carbon fiber powder has its fiber axis oriented in the sheet thickness direction in the polymer matrix. A more specific description of the carbon fiber powder being oriented in the thickness direction is that a state is created in which the percentage of the number of particles of the carbon fiber powder having an angle smaller than 30° between the fiber axis and the sheet thickness direction exceeds 50%.

The hardness of the carbon fiber oriented thermally conductive layer is preferably 5 to 60 in terms of E-hardness measured with a type E durometer in accordance with Japanese Industrial Standards, JIS K 6253.

When the E-hardness exceeds 60, the compressibility of the carbon fiber oriented thermally conductive layer is deteriorated during actual use, and the electrically insulating thermally conductive layer stacked thereon becomes excessively compressed such that the electrically insulating thermally conductive layer is compressed to a thickness below the assumed thickness. Moreover, the electrical insulating property may be degraded due to occurrence of cracks caused by deformation. Although the degradation of the electrical insulating property can be suppressed by making the electrically insulating thermally conductive layer harder, doing so will harden the entire thermally conductive sheet, deteriorate the ability to follow the shapes of the heat generating element and the heat dissipating element, and degrade adhesion between the thermally conductive sheet and the heat generating element or the heat dissipating element; and the heat conducting property may be degraded as a result. In contrast, when the E-hardness is 60 or less, the possibility that the electrically insulating thermally conductive layer becomes excessively compressed is low, and the thermally conductive sheet satisfactorily follows the shapes of the heat generating element and the heat dissipating element; thus, adhesion between the thermally conductive sheet and the heat generating element or the heat dissipating element can be satisfactorily obtained.

Meanwhile, when the E-hardness is less than 5, it is difficult to retain the shape, the orientation of the carbon fibers is disrupted by compression, and the heat conducting property may be impaired. As long as the E-hardness is 5 or more, the shape is easily retained and the handleability is improved.

The carbon fiber oriented thermally conductive layer becomes harder by increasing the amounts of the carbon fiber powder and the thermally conductive filler added thereto; thus, in order to adjust the hardness of the carbon fiber oriented thermally conductive layer to be within a preferable range, a material softer than the desired hardness when formed into a carbon fiber oriented thermally conductive layer is selected as the polymer matrix.

The thickness of the carbon fiber oriented thermally conductive layer is preferably 0.25 to 10 mm. At a thickness less than 0.25 mm, in orienting the carbon fiber powder inside a mold, not enough space needed for the carbon fiber powder to rotate is available due to the mold, and inhibition of rotation possibly results in insufficient orientation. At a thickness exceeding 10 mm, however, thermal resistance may increase.

The thermal conductivity of the carbon fiber oriented thermally conductive layer in the thickness direction, i.e., the direction in which the carbon fiber powder is oriented, can be in the range of 7 W/m·K or more and 30 W/m·K or less. The thermal conductivity is preferably as high as possible; however, there is a tendency in which as the difference relative to the thermal conductivity of the electrically insulating thermally conductive layer increases, the thermal conductivity of the thermally conductive sheet becomes more difficult to increase. At a thermal conductivity exceeding 30 W/m·K, the difference in thermal conductivity relative to the electrically insulating thermally conductive layer becomes excessively large, and the thermal conductivity of the thermally conductive sheet no longer shows substantial changes even if the thermal conductivity of the carbon fiber oriented thermally conductive layer is increased. The thermal conductivity can be calculated by the method of experimental examples described below. Note that, in the present invention, the term "thermal conductivity" refers to a thermal conductivity in the sheet thickness direction (the direction in which the carbon fiber powder is oriented) unless otherwise noted.

The carbon fiber oriented thermally conductive layer has electrical conductivity since it contains the oriented carbon fiber powder. The index of the electrical conductivity is preferably a volume resistivity of $10^4$ to $10^6$ Ω·cm. The electrical conductivity and the thermal conductivity are co-related to some extent since carbon fiber oriented thermally conductive layers having electrical conductivities within the range of $10^4$ to $10^6$ Ω·cm also have high thermal conductivities. The volume resistivity can be measured by interposing the carbon fiber oriented thermally conductive layer between gold-plated metal plates and measuring, with a tester, the resistance value at the time the carbon fiber oriented thermally conductive layer is compressed to 10% of the initial thickness.

The components that constitute the carbon fiber oriented thermally conductive layer are described next.

Polymer Matrix:

The polymer matrix is a polymer such as a resin or rubber, and is preferably formed by curing a liquid polymer composition of a mixed system, such as a main agent and a curing agent. Thus, the polymer composition can contain an un-crosslinked rubber and a crosslinking agent or can contain an un-crosslinked rubber containing a crosslinking agent, and a crosslinking accelerator. The curing reaction may involve room-temperature curing or thermal curing. When the polymer matrix is a silicone rubber, one example is alkenyl-group-containing organopolysiloxane and organohydrogenpolysiloxane. When the polymer matrix is a polyester-based thermoplastic elastomer, a diol and a dicarboxylic acid can be used. When the polymer matrix is a polyurethane-based thermoplastic elastomer, a diisocyanate and a diol can be used. Among these polymer compositions (polymer matrix before curing), an addition-reaction-type silicone rubber is preferably used since the polymer matrix obtained by curing is particularly soft and the thermally conductive filler can be smoothly added thereto.

Carbon Fiber Powder:

The carbon fiber powder to be contained in the polymer matrix contains a carbon fiber powder having a fibrous shape, a rod shape, a needle shape, or the like. In the carbon fiber powder, the graphite crystal surfaces are aligned in the fiber axis direction, and a significantly high thermal conductivity is exhibited in the fiber axis direction. Thus, by orienting the directions of the fiber axes in a particular direction, the thermal conductivity in that particular direction can be increased.

The carbon fibers used in the present invention are graphitized, and examples of the raw material therefor include fused polycyclic hydrocarbon compounds such as naphthalene, and fused heterocyclic compounds such as polyacrylonitrile (PAN) and pitch. In particular, use of mesophase pitch is preferable. When mesophase pitch is used, in the spinning step described below, the pitch becomes oriented in the fiber axis direction due to its anisotropy, and graphitized carbon fibers having an excellent heat conducting property in the fiber axis direction can be obtained. This mesophase pitch may be any mesophase pitch that can be spun, and one type of mesophase pitch may be used alone or a combination of multiple types of mesophase pitch may be used. However, the mesophase pitch is preferably used alone, in other words, graphitized carbon fibers with a mesophase pitch content of 100% are most preferable from the standpoints of enhancing the heat conducting property, spinnability, and quality stability.

Carbon fibers obtained by sequentially performing processes of spinning, stabilizing, and carbonizing, pulverizing or cutting the resulting product to a particular particle diameter, and graphitizing the resulting product, or by performing carbonizing, pulverizing or cutting, and graphitizing. When pulverizing or cutting is performed before graphitizing, polycondensation reaction and cyclization reaction proceed smoothly during the graphitizing process on the surfaces, which have been newly exposed by pulverizing, and thus the degree of graphitization can be increased and thus graphitized carbon fibers with a further improved heat conducting property can be obtained. In contrast, when the spun carbon fibers are graphitized and then pulverized, the carbon fibers after graphitization are stiff and thus are easy to pulverize. Thus, a carbon fiber powder having a relatively narrow fiber length distribution can be obtained by performing pulverization for a short period of time.

The fiber diameter of the carbon fibers is not particularly limited and is preferably 5 to 20 μm. When the fiber diameter is in the range of 5 to 20 μm, industrial production is smooth and the heat conducting property of the obtained carbon fiber oriented thermally conductive layer can be increased. When the fiber diameter is smaller than 5 μm or greater than 20 μm, the productivity is degraded.

The average fiber length of the carbon fibers is preferably 10 to 500 μm, more preferably 15 to 200 μm, and particularly preferably 15 to 120 μm. When the average fiber length is smaller than 10 μm, the graphitized carbon fibers contact less with one another in the polymer matrix, the heat transfer paths become insufficient, and the heat conducting property of the carbon fiber oriented thermally conductive layer obtained therefrom is degraded. In contrast, when the average fiber length is greater than 500 μm, the carbon fibers become bulky, and it becomes difficult to add a large quantity of carbon fibers to the polymer matrix. In addition, the electrical conductivity of the carbon fiber oriented thermally conductive layer may increase. Note that the average fiber length can be calculated from the particle size distribution obtained by observation of carbon fibers with a microscope.

The average fiber length of the carbon fibers is preferably 50% or less of the thickness of the carbon fiber oriented thermally conductive layer, and the content of the carbon fibers having a fiber length exceeding 80% of the thickness of the carbon fiber oriented thermally conductive layer is preferably 5% by mass or less. When the content of the carbon fibers having a fiber length exceeding 80% of the thickness of the carbon fiber oriented thermally conductive layer exceeds 5% by mass, the carbon fibers become longer than the compressed thickness of the thermally conductive sheet when the thermally conductive sheet is compressed, and there is a possibility that the carbon fibers may significantly penetrate the electrically insulating thermally conductive layer. When the carbon fibers penetrate the electrically insulating thermally conductive layer, the thickness for enhancing the electrical insulating property is decreased, and thus the electrical insulating property may be degraded. When the carbon fibers penetrate through the electrically insulating thermally conductive layer, the electrical insulating property is impaired. In view of this, when the average fiber length of the carbon fibers is also 50% or less of the thickness of the carbon fiber oriented thermally conductive layer, the amount of the carbon fibers that exceed the thickness of the carbon fiber oriented thermally conductive layer during compression can be decreased. In order to address these risks, the particle size distribution of the carbon fibers is preferably narrow. A multiple types of carbon fibers having different particle size distributions are preferably mixed and used so that the thermal conductivity can be increased.

The aspect ratio of the carbon fiber powder preferably exceeds 2. This is because, at an aspect ratio of 2 or less, it is difficult to orient the carbon fiber powder in a particular direction and to increase heat conducting property. More preferably, the aspect ratio is 5 or more. The aspect ratio here is the value of "length of fiber/diameter of fiber" of the carbon fiber powder.

The thermal conductivity of the carbon fibers is not particularly limited, but the thermal conductivity in the fiber axis direction is preferably 400 W/m·K or more, more preferably 800 W/m·K or more, and particularly preferably 1000 W/m·K or more.

The amount of the carbon fiber powder relative to 100 parts by mass of the polymer matrix is preferably 75 to 150 parts by mass. If the amount is smaller than 75 parts by mass, the heat conducting property is difficult to enhance. At an amount exceeding 150 parts by mass, the viscosity of the mixed composition increases and the orientation property may be degraded.

Thermally Conductive Filler

The thermally conductive filler is preferably contained in the carbon fiber oriented thermally conductive layer in addition to the carbon fiber powder, and is a material that imparts a heat conducting property to the polymer matrix together with the carbon fiber powder. In particular, a thermally conductive filler having an aspect ratio of 2 or less is preferably contained.

When the carbon fiber powder is oriented in the sheet thickness direction and when a thermally conductive filler other than the carbon fiber powder, more preferably a thermally conductive filler having a small aspect ratio, is contained, the thermally conductive filler satisfactorily occupies the gaps between the surfaces of the oriented carbon fiber powder, and a carbon fiber oriented thermally conductive layer having a high thermal conductivity is obtained.

Examples of the thermally conductive filler include spherical or irregular powders of metals, metal oxides, metal nitrides, metal carbides, and metal hydroxides; and spherical graphite. Examples of the metal include aluminum, copper, and nickel. Examples of the metal oxide include aluminum oxide, magnesium oxide, zinc oxide, and quartz. Examples of the metal nitride include boron nitride and aluminum nitride. An example of the metal carbide is a silicon carbide, and an example of the metal hydroxide is aluminum hydroxide. Among these thermally conductive fillers, aluminum oxide and aluminum, which have a high thermal conductivity and are readily available as spherical products, are preferable, and aluminum oxide is also preferable since it is readily available and can enhance flame retardancy of the thermally conductive sheet.

The thermally conductive filler preferably has an aspect ratio of 2 or less. This is because, at an aspect ratio exceeding 2, the viscosity tends to increase and it becomes difficult to add the filler in a large quantity. Due to these reasons, the thermally conductive filler is preferably spherical in shape.

The average particle diameter of the thermally conductive filler is preferably 0.5 to 35 µm. At an average particle diameter exceeding 35 µm, the size approach the size of the carbon fiber powder, and the orientation of the carbon fiber powder may be disrupted. In contrast, a thermally conductive filler having an average particle diameter smaller than 0.5 µm has a large specific surface area, and thus the viscosity tends to increase. Then it is difficult to add a large quantity of the filler. However, as long as addition of the filler is not adversely affected, a thermally conductive filler smaller than 0.5 µm may be contained. The average particle diameter of the thermally conductive filler can be indicated by a volume-average particle diameter of the particle size distribution measured by a laser diffraction scattering method (JIS R 1629).

The amount of the thermally conductive filler added relative to the 100 parts by mass of the polymer matrix is preferably in the range of 250 to 800 parts by mass and more preferably in the range of 350 to 700 parts by mass. When the amount is smaller than 250 parts by mass, the amount of the thermally conductive filler occupying the gaps between the carbon fiber particles becomes insufficient, and the heat conducting property may be degraded. The effect of enhancing the heat conducting property stops improving when the amount exceeds 800 parts by mass, and heat transfer through carbon fiber powder may be inhibited as such an amount. In the range of 350 to 700 parts by mass, the heat conducting property is excellent, and the viscosity of the mixed composition is appropriate.

Additives:

Various additives may be contained as long as the functions of the thermally conductive sheet are not impaired. For example, organic components, such as a plasticizer, a dispersing agent, a coupling agent, and an adhesive may be contained. As other components, a flame retardant, an antioxidant, a coloring agent, and the like may be added as appropriate.

When the carbon fiber oriented thermally conductive layer contains the thermally conductive filler along with the carbon fiber powder, a sheet that has a relatively small carbon fiber content and has excellent softness and an excellent tacking property at sheet surfaces can be made. Thus, even when the sheet is interposed between a heat generating element and a heat dissipating element and pressurized, the compression stress is low and the possibility of deformation of the substrate or excessive pressure onto the substrate is low. When a surface of the carbon fiber oriented thermally conductive layer is exposed in a surface of the thermally conductive sheet, a thermally conductive sheet that can be easily fixed to the heat generating element or the heat dissipating element and that has excellent workability is obtained. In stacking the carbon fiber oriented thermally conductive layer on the electrically insulating thermally conductive layer, since the carbon fiber oriented thermally conductive layer has a tacking property, it easily integrates with the electrically insulating thermally conductive layer without providing an adhesive layer. Thus, the cost for providing an adhesive layer is not needed, and degradation of the heat conducting property due to the adhesive layer is not a concern.

<Electrically Insulating Thermally Conductive Layer>

The electrically insulating thermally conductive layer is a layer formed to have a sheet shape by curing a mixed composition in which the electrically insulating thermally conductive filler is blended to a liquid polymer composition that forms a polymer matrix, has an electrical insulating property, and imparts the electrical insulating property to the thermally conductive sheet obtained by stacking the electrically insulating thermally conductive layer on the carbon fiber oriented thermally conductive layer.

Since the electrically insulating thermally conductive layer imparts the electrical insulating property to the thermally conductive sheet, it preferably has a particular breakdown voltage. The breakdown voltage is a voltage at which an electrically insulating sample interposed between two electrodes and under gradually increasing voltage starts to conduct electricity as the sample partly melts to bear holes or becomes carbonized due to a sharply rising current. More specifically, the breakdown voltage is preferably 3 kV/mm or more and more preferably 5 kV/mm or more in terms of a breakdown voltage measured with a withstanding voltage tester (TOS8650 produced by KIKUSUI ELECTRONICS CORPORATION) in accordance with JIS K 6249.

The electrically insulating thermally conductive layer in which the electrically insulating thermally conductive filler is blended into the polymer matrix is preferably harder than the carbon fiber oriented thermally conductive layer and preferably has an E-hardness of 70 or less and 20 or more measured with a type E durometer in accordance with Japanese Industrial Standards, JIS K 6253.

When the electrically insulating thermally conductive layer is softer than the carbon fiber oriented thermally conductive layer, the electrically insulating thermally conductive layer may be excessively compressed during actual use and the electrical insulating property may become impaired. In contrast, when the hardness of the electrically insulating thermally conductive layer exceeds 70 in terms of E-hardness, adhesion to the object to be attached is deteriorated due to an increase in hardness, and an increase in thermal resistance becomes a concern.

When the hardness of the electrically insulating thermally conductive layer is 20 or more in terms of E-hardness, an electrically insulating thermally conductive layer with strength can be formed, and a stable electrical insulating property can be maintained even when compressed. Since the electrically insulating thermally conductive layer also has flexibility to follow the object to be attached, the thermal resistance can be decreased.

The thickness of the electrically insulating thermally conductive layer is preferably 0.15 to 1.5 mm and more preferably 0.25 to 1.5 mm. At a thickness less than 0.15 mm, pinholes may be generated, and the electrical insulating property may be impaired due to an excessively small thickness. In contrast, when the thickness exceeds 1.5 mm, the effect of the heat transfer inhibition brought by the electrically insulating thermally conductive layer may become extensive. As long as the thickness is 0.25 mm or more, the breakdown voltage is high, and a stable electrical insulating property can be obtained.

The thermal conductivity of the electrically insulating thermally conductive layer is preferably 2 W/m·K or more and less than 7 W/m·K and more preferably 5 W/m·K or more and less than 7 W/m·K. When the thermal conductivity is less than 2 W/m·K, the thermal conductivity of the thermally conductive sheet may be significantly decreased. In contrast, at 7 W/m·K or more, the amount of the electrically insulating thermally conductive filler increases, thereby making the electrically insulating thermally conductive layer brittle, and the electrical insulating property may be impaired due to compression or deformation. At 5 W/m·K or more and less than 7 W/m·K, the decrease in the thermal conductivity can be decreased.

Unless otherwise noted, the thermal conductivity of the electrically insulating thermally conductive layer is the thermal conductivity in the thickness direction. For example, when the electrically insulating thermally conductive filler, such as boron nitride, having a shape anisotropy is oriented so that its long axis is oriented in the thickness direction, the thermal conductivity in the thickness direction can be increased. In contrast, when an electrically insulating thermally conductive filler having no shape anisotropy, such as a spherical filler, is blended, the electrically insulating thermally conductive layer has an isotropic thermal conductivity.

The thermal conductivity (W) (unit: W/m·K) and the thickness (T) (unit: mm) of the electrically insulating thermally conductive layer preferably satisfy the relationship represented by formula (1) below:

$$0 < T \leq 0.20\ W - 0.19 \qquad \text{formula (1)}$$

When this relationship is satisfied, a thermally conductive sheet having a high thermal conductivity can be obtained.

Among the components constituting the electrically insulating thermally conductive layer, the polymer matrix and the additives can be made of the types of materials described for the carbon fiber oriented thermally conductive layer. Of the examples of the polymer matrix, the same polymer matrix used in the carbon fiber oriented thermally conductive layer can be used as the polymer matrix of the electrically insulating thermally conductive layer also; in such a case, since the chemical structure is identical, a thermally conductive sheet having excellent adhesion between the carbon fiber oriented thermally conductive layer and the electrically insulating thermally conductive layer is obtained. Moreover, since the material used is common, production control is facilitated, which is an advantage.

Alternatively, a polymer matrix of a material different from that of the polymer matrix employed in the carbon fiber oriented thermally conductive layer may be used in the electrically insulating thermally conductive layer. For example, silicone is used in the layer that comes into contact with a heat dissipating element, and a non-silicone-based material is used in the layer that comes into contact with an electronic device such as a substrate so that bleed-out of silicone toward the substrate can be suppressed and transpiration of low-molecular-weight siloxane can be decreased. Another example involves separately selecting the material for the carbon fiber oriented thermally conductive layer and the material for the electrically insulating thermally conductive layer according to the object to be attached, such as selecting a polymer matrix of a material that easily adheres to the object to be attached depending on the raw material of the object to be attached.

The electrically insulating thermally conductive filler is a material that imparts the heat conducting property to the polymer matrix in the electrically insulating thermally conductive layer, and an electrical insulating material among the types of the materials described for the carbon fiber oriented thermally conductive layer can be used in the electrically insulating thermally conductive layer also.

Of such electrically insulating thermally conductive fillers, aluminum oxide is preferable since it has a spherical shape and a high thermal conductivity, and aluminum hydroxide is preferable since the flame retardancy of the thermally conductive sheet can be enhanced. A spherical filler is easy to add in a large quantity since its viscosity does not easily increase. Aluminum oxide and aluminum hydroxide are preferable also from the viewpoint of availability.

The average particle diameter of the electrically insulating thermally conductive filler is preferably 0.5 to 50 μm. At an average particle diameter exceeding 50 μm, formability is notably degraded. In contrast, a thermally conductive filler having an average particle diameter smaller than 0.5 μm is difficult to add in a large quantity since it tends to have a high viscosity due to a large specific surface area. As long as the addition of the filler is not adversely affected, a thermally conductive filler smaller than 0.5 μm may be contained.

The amount of the electrically insulating thermally conductive filler added relative to 100 parts by mass of the polymer matrix is preferably in the range of 300 to 2000 parts by mass and more preferably in the range of 500 to 2000 parts by mass. When the amount is smaller than 300 parts by mass, the heat conducting property may be degraded. At an amount exceeding 2000 parts by mass, an effect of enhancing the heat conducting property is weak, but formability is degraded, thereby making it difficult to form a thin electrically insulating thermally conductive layer. In the range of 500 to 1500 parts by mass, the heat conducting property is excellent, and the viscosity of the liquid composition before curing into the electrically insulating thermally conductive layer is appropriate.

When the electrically insulating thermally conductive layer contains the electrically insulating thermally conductive filler but not a carbon fiber powder, a sheet having a heat conducting property and a high electrical insulating property can be obtained. Thus, an electrical insulating property can be imparted to the thermally conductive sheet. Since the electrically insulating thermally conductive layer has some degree of softness while being harder than the carbon fiber oriented thermally conductive layer, the electrically insulating thermally conductive layer is not as easily compressed as the carbon fiber oriented thermally conductive layer when interposed between the heat generating element and the heat dissipating element and compressed, and the electrical insulating property can be easily maintained. Moreover, adhesion to the object to be attached is also high.

<Thermally Conductive Sheet>

The thermally conductive sheet in which the carbon fiber oriented thermally conductive layer and the electrically insulating thermally conductive layer are stacked has the following properties.

First, the thermal conductivity of the thermally conductive sheet is about 3 to 30 W/m·K and is preferably 10 W/m·K or more. This is because as long as the thermal conductivity is 10 W/m·K or more, the heat conducting property required for the thermally conductive sheet is provided.

A preferable thermal conductivity of the carbon fiber oriented thermally conductive layer is 7 W/m·K or more and 30 W/m·K or less, and a preferable thermal conductivity of the electrically insulating thermally conductive layer is 2 W/m·K or more and less than 7 W/m·K. However, the difference in thermal conductivity between the two layers is preferably small. This is because, as the difference in thermal conductivity increases, the thermal conductivity of the thermally conductive sheet tends to become more difficult to increase, and when the difference in thermal conductivity between the carbon fiber oriented thermally conductive layer and the electrically insulating thermally conductive layer is excessively large, the thermal conductivity of the thermally conductive sheet remains substantially the same even if the thermal conductivity of the carbon fiber oriented thermally conductive layer is increased. From this viewpoint, the ratio of the thermal conductivity of the carbon fiber oriented thermally conductive layer to the thermal conductivity of the electrically insulating thermally conductive layer is preferably 5 or less.

While the thermally conductive sheet has the thermal conductivity described above, it also has a particular electrical insulating property. Specifically, since the electrically insulating thermally conductive layer having a breakdown voltage of 5 kV/mm or higher is included, the breakdown voltage of the thermally conductive sheet can also be 5 kV/mm or more.

As for the ratio between the thickness of the carbon fiber oriented thermally conductive layer and the thickness of the electrically insulating thermally conductive layer, when the thickness of the carbon fiber oriented thermally conductive layer is assumed to be 1, the thickness of the electrically insulating thermally conductive layer is in the range of 1 to 0.015. When the electrically insulating thermally conductive layer is made thicker so as to exceed "thickness of carbon fiber oriented thermally conductive layer":"thickness of thermally conductive sheet"=1:1, contribution of the electrically insulating thermally conductive layer to the thermal conductivity of the thermally conductive sheet is increased, and the thermal conductivity may decrease. When the electrically insulating thermally conductive layer is made thinner so that this ratio exceeds 1:0.015, the electrical insulating property may be degraded or the thermal resistance may become excessively high due to the thick carbon fiber oriented thermally conductive layer.

<Method for Producing Thermally Conductive Sheet>

One example of a method for producing a thermally conductive sheet is a method that includes producing a carbon fiber oriented thermally conductive layer and an electrically insulating thermally conductive layer separately and then bonding these together.

One example of a method for producing the carbon fiber oriented thermally conductive layer is a magnetic field orientation method that involves placing a mixed composition, which contains a liquid polymer composition, a carbon fiber powder, and a thermally conductive filler, in a magnetic field, causing the carbon fiber powder to orient along the magnetic field, and curing the polymer composition so as to obtain the carbon fiber oriented thermally conductive layer.

The components that constitute the mixed composition in which the carbon fiber powder and the thermally conductive filler are homogeneously dispersed in the liquid polymer composition are preferably contained so that, relative to 100 parts by mass of the polymer composition, 75 to 150 parts by mass of the carbon fiber powder and 250 to 800 parts by mass of the thermally conductive filler are contained. These ratios converted into percent by volume correspond to about 10% to 25% by volume of the carbon fiber powder and about 25% to 60% by volume of the thermally conductive filler relative to about 30% to 50% by volume of the polymer composition. Additives and the like may be added thereto as appropriate.

For magnetic field orientation, the viscosity of the mixed composition is preferably 10 to 300 Pa·s. This is because, at a viscosity lower than 10 Pa·s, the carbon fiber powder and the thermally conductive filler may settle, whereas at a viscosity exceeding 300 Pa·s, the flowability is so low that the carbon fiber powder fails to orient or takes too much time to orient. However, by using a thermally conductive filler that does not easily settle or by using an additive, such as an anti-settling additive, in combination, the viscosity can be decreased to less than 10 Pa·s in some cases.

Examples of the magnetic line generator used to apply magnetic lines in the magnetic field orientation method include a superconducting magnet, a permanent magnet, an electromagnet, and a coil; however, a superconducting magnet is preferable since it can generate a magnetic field of a high magnetic flux density. The magnetic flux densities of the magnetic fields generated from these magnetic line generators are preferably 1 to 30 tesla. When the magnetic flux density is less than 1 tesla, it becomes difficult to orient the carbon fiber powder. Meanwhile, a magnetic flux density exceeding 30 tesla is practically difficult to obtain.

The formed body obtained in the magnetic field orientation method can be directly used as the carbon fiber oriented thermally conductive layer, or may be sliced or cut into a final shape. The carbon fiber oriented thermally conductive layer formed by using a mold sometimes has a very thin skin layer formed of the polymer matrix on the surface of the sheet. This skin layer has an effect of suppressing detachment of the carbon fiber powder and the thermally conductive filler.

A second method for producing the carbon fiber oriented thermally conductive layer is a stack slicing method that involves preparing auxiliary sheets formed by applying shear force to a mixed composition so as to form thin plates, stacking multiple auxiliary sheets, curing the resulting stack to prepare a multilayer block, and slicing the multilayer block.

In the stack slicing method, first, a carbon fiber powder, a thermally conductive filler, and, if needed, various additives are added to a liquid polymer composition, and the resulting mixture is stirred so as to prepare a mixed composition in which solid matters mixed therein are homogeneously dispersed. The mixed composition preferably has a relatively high viscosity of 10 to 1,000 Pa·s so that shear force is applied when the mixed composition is stretched to have a sheet shape.

Next, while shear force is applied to the mixed composition, the mixed composition is stretched flat into a sheet shape. When shear force is applied, the carbon fiber powder can be oriented in the shear direction. Examples of the means for forming the sheet include applicators for coating, such as a bar coater and a doctor blade, and a method involving applying the mixed composition to a substrate film by extrusion molding or discharging from nozzles, etc. The sheet thickness at this stage is preferably about 50 to 250 μm. Thus, auxiliary sheets can be obtained. In these auxiliary sheets, the carbon fiber powder is oriented in one direction within the plane of the sheet.

The auxiliary sheets are stacked so that their orientation directions coincide, and then the mixed composition is cured by a curing means appropriate for curing the polymer composition, such as UV irradiation or hot pressing, so as to form a multilayer block. Finally, the multilayer block is cut in a direction orthogonal to the direction in which the carbon fiber powder is oriented so as to obtain a sheet-shaped carbon fiber oriented thermally conductive layer.

The first method, which is the magnetic field orientation method, and the second method, which is the stack slicing method, are compared.

According to the stack slicing method, preparation of a soft and thin carbon fiber oriented thermally conductive layer is difficult. For example, when an OO hardness is about 50 or less, the sheet is too soft even with the sharpest edge possible, and thus the sheet is significantly deformed by the pressing force of slicing, making it difficult to obtain a good quality thin film sheet. One approach to address this issue is to freeze the sheet and slice. However, while the freezing approach works effectively for acrylic gel and the like, the hardness of the sheet containing silicone as the polymer matrix remains substantially the same even when the sheet is frozen to −40° C., and thus, the hardness during slicing cannot be improved. The sheets can be hardened if cooled to a further lower temperature (in practice, about −60° C.); however, special equipment is necessary to cool the sheet to a temperature below −40° C. Moreover, considering also that cooling is inhibited by the heat of friction during slicing, this approach is impractical.

The thermally conductive sheet is typically used by being compressed by about 10% to 40% in order to ensure adhesion between the objects to be attached and to decrease thermal resistance. At this time, when the thermally conductive sheet is soft, the stress of compression is low, and there is a lower possibility of stress-induced deformation of the substrate, which is an object to be attached. However, according to the stack slicing method, the hardness is limited, and thus it is difficult to obtain a very soft thermally conductive sheet.

In addition, according to the stack slicing method, there arises a problem of anisotropy in the physical properties and heat conducting property of the thermally conductive sheet in the surface direction. Moreover, since the adhesiveness of the surface is impaired, the thermally conductive sheet is difficult to be fixed to the object to be attached, leading to a problem of poor workability. Furthermore, additional steps of stacking and bonding the sheets and slicing the stacked sheets are needed, and this increases the cost. When the thermally conductive sheet is interposed between a heat generating element and a heat dissipating element, pressurizing force acts in the direction in which the bonding surfaces of the sheets collapse. As a result, the bonding surfaces may detach or the particles of the carbon fiber powder may separate from one another.

Compared to this stack slicing method, the magnetic field orientation method does not have the problem of likely separation of bonding surfaces since the bonding surface created by bonding the multiple sheets are not present. Moreover, while the surface preferably has adhesiveness in stacking the sheet with the electrically insulating thermally conductive layer, the magnetic field orientation method can easily form such an adhesive surface. Thus, due to these reasons, the magnetic field orientation method is more preferable for the production.

It should be noted that in both the magnetic field orientation method and the stack slicing method, the carbon fiber powder and the thermally conductive filler appear in cut surfaces when slicing or cutting is performed along a plane perpendicular to the orientation direction; thus, the area where the carbon fiber powder and the thermally conductive filler contact the object to be attached is increased, and the heat conducting property can be enhanced.

Next, a method for producing the electrically insulating thermally conductive layer is described.

In order to form the electrically insulating thermally conductive layer, a mixed composition containing a liquid polymer composition and a thermally conductive filler is prepared, and then the polymer composition is cured. As for the components constituting the mixed composition, 300 to 2000 parts by mass of the thermally conductive filler is preferably contained relative to 100 parts by mass of the polymer composition. The ratio converted into percent by volume corresponds to about 50% to 90% by volume of the thermally conductive filler in the polymer composition. Additives and the like may be added thereto as appropriate.

Examples of the method for forming the electrically insulating thermally conductive layer include a bar coater method, a doctor blade method, an extrusion molding method (T die method and the like), a calendar forming method, a press forming method, and a mold injection method. Thus, the viscosity of the mixed composition is preferably within the range in which thin films can be formed by these methods.

In bonding the carbon fiber oriented thermally conductive layer and the electrically insulating thermally conductive layer, as long as at least one of the carbon fiber oriented thermally conductive layer and the electrically insulating thermally conductive layer has an adhesiveness derived from the polymer matrix, the layers can be integrated by direct bonding. From the viewpoint of bonding, both the carbon fiber oriented thermally conductive layer and the electrically insulating thermally conductive layer preferably have adhesiveness. Since the carbon fiber oriented thermally conductive layer and the electrically insulating thermally conductive layer both have particular softness, their surfaces often have adhesiveness enough to allow direct bonding. However, in the absence of such adhesiveness, an adhesive or the like may be interposed in stacking these layers.

Another example of the method for producing the thermally conductive sheet is a method that involves first forming a carbon fiber oriented thermally conductive layer into a sheet shape, applying a mixed composition that forms an electrically insulating thermally conductive layer to the carbon fiber oriented thermally conductive layer, and then curing the polymer composition. According to this method, since the electrically insulating thermally conductive layer is cured on the surface of the carbon fiber oriented thermally conductive layer, a process of bonding the two layers can be omitted.

When a skin layer formed of the polymer matrix is formed on the surface of the carbon fiber oriented thermally conductive layer, the surface may be sliced or cut to expose the carbon fiber powder and the thermally conductive filler, then the mixed composition that forms the electrically insulating thermally conductive layer may be applied thereon, and then the polymer composition may be cured. In this manner, the skin layers between the layers disappear, and the thermal conductivity of the thermally conductive sheet can be increased.

Yet another example of the method for forming the thermally conductive sheet is a method that involves first forming an electrically insulating thermally conductive layer into a sheet shape, applying a mixed composition that forms a carbon fiber oriented thermally conductive layer on the electrically insulating thermally conductive layer, and curing the polymer composition while orienting the carbon fiber powder by the magnetic field orientation method. According to this method also, since the carbon fiber oriented thermally conductive layer is cured on the surface of the electrically insulating thermally conductive layer, a process of bonding the two layers can be omitted, which is an advantage.

It should be noted that these methods for production are merely illustrative, and any other now method can be employed.

Second Embodiment

A thermally conductive sheet according to a second embodiment is a thermally conductive sheet having a sheet shape in which electrically insulating thermally conductive layers are stacked on both surfaces of a carbon fiber oriented thermally conductive layer. According to this embodiment, since the carbon fiber oriented thermally conductive layer containing carbon fibers, which are an electrically conductive powder, is interposed between the electrically insulating thermally conductive layers, detachment of the carbon fibers can be prevented, and shorting of the circuit can be suppressed.

Third Embodiment

A thermally conductive sheet according to a third embodiment is a thermally conductive sheet having a sheet shape in which carbon fiber oriented thermally conductive layers are stacked on both surfaces of an electrically insulating thermally conductive layer. When the carbon fiber oriented thermally conductive layers are prepared by the above-described stack slicing method or when the surfaces of the carbon fiber oriented thermally conductive layers are sliced or cut to expose the carbon fiber powder and the thermally conductive filler, the tacking property of the surfaces can be decreased. As a result, the thermally conductive sheet can have good slidability at both surfaces.

The characteristic features of the respective embodiments can be combined as long as no adverse effects are created. For example, two thermally conductive sheets described in the first embodiment may be stacked.

EXAMPLES

The present invention will now be described further through more specific examples.

Preparation of Carbon Fiber Oriented Thermally Conductive Layer:

Carbon fiber oriented thermally conductive layers 1 to 4 described below were prepared.

<Carbon Fiber Oriented Thermally Conductive Layer 1>

A carbon fiber powder (average fiber length: 100 µm, specific gravity: 2.2), spherical aluminum oxide (specific gravity: 4.0) having a particle diameter of 3 µm and an aspect ratio of substantially 1 and serving as a thermally conductive filler 1, and spherical aluminum oxide (specific gravity: 4.0) having a particle diameter of 10 µm and an aspect ratio of substantially 1 and serving as a thermally conductive filler 2 were blended into a liquid polymer composition of an addition-reaction-type silicone, which was a mixture (specific gravity: 1.0) of an alkenyl-group-containing polyorganosiloxane (main agent) and organohydrogenpolysiloxane (curing agent), so that the ratios (indicated in terms of parts by mass) of these components were as indicated in Table 1. The resulting composition was mixed and stirred to homogeneity and defoamed so as to prepare a mixed composition for a carbon fiber oriented thermally conductive layer 1. A carbon fiber powder and a thermally conductive filler that had been surface-treated with a silane coupling agent in advance were used as the carbon fiber powder and the thermally conductive filler.

Subsequently, the mixed composition was formed into a sheet shape by mold forming. The formed body was placed to stand still in a 8 tesla magnetic field induced by a superconducting magnet for 10 minutes so that the magnetic lines were applied in the sheet thickness direction. Next, the formed body was heated at 120° C. for 30 minutes to obtain a carbon fiber oriented thermally conductive layer 1. The carbon fiber oriented thermally conductive layer 1 was prepared as a test piece having a thickness of 2.0 mm and as a test piece having a thickness of 10.0 mm.

The average particle diameter of the thermally conductive filler was the volume-average particle diameter determined from a particle size distribution measured by a laser diffraction scattering method (JIS R 1629). The aspect ratio of the thermally conductive filler was determined by observation with an electron microscope. The aspect ratios of the thermally conductive fillers 1 and 2 and the thermally conductive filler 3 described below were about 1.0.

<Carbon Fiber Oriented Thermally Conductive Layers 2 to 4>

The carbon fiber oriented thermally conductive layers 2 to 4 were prepared by the same method as that for the carbon fiber oriented thermally conductive layer 1 but by changing the blend of the components in the mixed composition from that used to prepare the carbon fiber oriented thermally conductive layer 1. The blend (parts by mass) of the components in the mixed compositions that form the carbon fiber oriented thermally conductive layers 2 to 4 are indicated in Table 1. The carbon fiber oriented thermally conductive layers 2 to 4 were also prepared as a test piece having a thickness of 2.0 mm and a test piece having a thickness of 10.0 mm.

TABLE 1

|  |  | Carbon fiber oriented thermally conductive layer 1 | Carbon fiber oriented thermally conductive layer 2 | Carbon fiber oriented thermally conductive layer 3 | Carbon fiber oriented thermally conductive layer 4 |
|---|---|---|---|---|---|
| Blend | Carbon fiber powder | 100 | 60 | 100 | 100 |
|  | Thermally conductive filler 1 | 250 | 250 | 250 | 250 |
|  | Thermally conductive filler 2 | 200 | 200 | 200 | 200 |
|  | Electrically insulating thermally conductive filler 3 | — | — | — | — |
|  | Main agent | 90 | 90 | 83 | 80 |
|  | Curing agent | 10 | 10 | 17 | 20 |
|  | Plasticizer | — | — | — | — |

Preparation of Electrically Insulating Thermally Conductive Layer:

Electrically insulating thermally conductive layers 1 to 8 described below were prepared.

<Electrically Insulating Thermally Conductive Layer 1>

Spherical aluminum oxide (specific gravity: 4.0) having a particle diameter of 3 μm and an aspect ratio of substantially 1 identical to the thermally conductive filler 1 and serving as the electrically insulating thermally conductive filler, and spherical aluminum (specific gravity: 4.0) having a particle diameter of 40 μm and an aspect ratio of substantially 1 and serving as an electrically insulating thermally conductive filler 3 were blended into the same addition-reaction-type silicone (main agent and curing agent) used in the carbon fiber oriented thermally conductive layer 1 as the liquid polymer composition so that the ratios (indicated in terms of parts by mass) of these components were as indicated in Table 2. The resulting mixture was mixed and stirred and defoamed so as to prepare a mixed composition for an electrically insulating thermally conductive layer 1. An electrically insulating thermally conductive filler that had been surface-treated with a silane coupling agent in advance was used as the electrically insulating thermally conductive filler. Subsequently, the mixed composition was formed into a sheet shape by mold forming and heated at 120° C. for 30 minutes to obtain an electrically insulating thermally conductive layer 1. The electrically insulating thermally conductive layer 1 was prepared as test pieces respectively having a thickness of 0.10 mm, 0.15 mm, 0.25 mm, 0.50 mm, 0.75 mm, and 10.0 mm.

<Electrically Insulating Thermally Conductive Layers 2 to 8>

The electrically insulating thermally conductive layers 2 to 8 were prepared by the same method as that for producing the electrically insulating thermally conductive layer 1 but by changing the blend of the mixed composition used for producing the electrically insulating thermally conductive layer 1 to the blend (parts by mass) indicated in Table 2. The plasticizer added to the electrically insulating thermally conductive layers 4 and 5 was dimethylpolysiloxane (silicone oil) (viscosity: 100 mPa·s).

The electrically insulating thermally conductive layers 2 to 8 were prepared as a test piece having a thickness of 0.5 mm and a test piece having a thickness of 10.0 mm. For the electrically insulating thermally conductive layer 6, a test piece having a thickness of 0.25 mm and a test piece having a thickness of 0.75 mm were also prepared.

TABLE 2

| | | Electrically insulating thermally conductive layer 1 | Electrically insulating thermally conductive layer 2 | Electrically insulating thermally conductive layer 3 | Electrically insulating thermally conductive layer 4 | Electrically insulating thermally conductive layer 5 | Electrically insulating thermally conductive layer 6 | Electrically insulating thermally conductive layer 7 | Electrically insulating thermally conductive layer 8 |
|---|---|---|---|---|---|---|---|---|---|
| Blend | Carbon fiber powder | — | — | — | — | — | — | — | — |
| | Thermally conductive filler 1 | 520 | 520 | 520 | 560 | 560 | 240 | 320 | 520 |
| | Thermally conductive filler 2 | — | — | — | — | — | — | — | — |
| | Electrically insulating thermally conductive filler 3 | 780 | 780 | 780 | 840 | 840 | 360 | 480 | 780 |
| | Main agent | 90 | 82 | 80 | 64 | 66 | 88 | 85 | 95 |
| | Curing agent | 10 | 18 | 20 | 6 | 4 | 12 | 15 | 5 |
| | Plasticizer | — | — | — | 30 | 30 | — | — | — |

Preparation of Thermally Conductive Sheet:

Thermally conductive sheets 1 to 21 described below were prepared.

<Thermally Conductive Sheets 1 to 19>

A carbon fiber oriented thermally conductive layer and an electrically insulating thermally conductive layer were selected from the carbon fiber oriented thermally conductive layers 1 to 4 and the electrically insulating thermally conductive layers 1 to 8 as indicated in Tables 3 to 5 below, and the selected carbon fiber oriented thermally conductive layer and electrically insulating thermally conductive layer were stacked to prepare thermally conductive sheets 1 to 19.

Surfaces of all of the carbon fiber oriented thermally conductive layers 1 to 4 and the electrically insulating thermally conductive layers 1 to 8 have slight adhesiveness. They can be integrated by simply directly stacking them and do not easily come apart.

<Thermally Conductive Sheet 20>

The carbon fiber oriented thermally conductive layer 1 with no electrically insulating thermally conductive layer provided thereto was used as a thermally conductive sheet 20.

<Thermally Conductive Sheet 21>

A thermally conductive sheet 21 was prepared by stacking a polyimide film (having a thermal conductivity of 0.16 W/m·K and a thickness of 50 μm), as a comparison to the electrically insulating thermally conductive layer, on the carbon fiber oriented thermally conductive layer 1.

TABLE 3

|  | Thermally conductive sheet 1 | Thermally conductive sheet 2 | Thermally conductive sheet 3 | Thermally conductive sheet 4 | Thermally conductive sheet 5 | Thermally conductive sheet 6 | Thermally conductive sheet 7 | Thermally conductive sheet 8 |
|---|---|---|---|---|---|---|---|---|
| Carbon fiber oriented thermally conductive layer No. | 1 | 1 | 1 | 1 | 1 | 1 | 3 | 4 |
| Thickness (mm) | 2 | 2 | 2 | 2 | 2 | 2 | 2 | 2 |
| E-hardness | 30 | 30 | 30 | 30 | 30 | 30 | 60 | 75 |
| Penetration (μm) | 66.3 | 66.3 | 66.3 | 66.3 | 66.3 | 66.3 | 16.7 | 7.3 |
| Thermal conductivity (W/m·K) | 12.9 | 12.9 | 12.9 | 12.9 | 12.9 | 12.9 | 12.9 | 12.9 |
| Electrically insulating thermally conductive layer No. | 1 | 8 | 2 | 3 | 5 | 4 | 2 | 3 |
| Thickness (mm) | 0.5 | 0.5 | 0.5 | 0.5 | 0.5 | 0.5 | 0.5 | 0.5 |
| E-hardness | 40 | 10 | 70 | 80 | 18 | 25 | 70 | 80 |
| Penetration (μm) | 12.3 | 69.9 | 6.1 | 5.1 | 33.4 | 22.1 | 5.9 | 5.1 |
| Thermal conductivity (W/m·K) | 5.0 | 5.0 | 5.0 | 5.0 | 6.0 | 6.0 | 5.0 | 5.0 |
| Evaluation Thermal conductivity (W/m·K) | 11.9 | 12.5 | 11.4 | 10 | 12.4 | 11.6 | 9.4 | 9.1 |
| Rate of decrease in thermal conductivity (%) | 7.8 ○ | 3.1 ○ | 11.6 ○ | 22.5 Δ | 3.9 ○ | 10.1 ○ | 27.1 Δ | 29.5 Δ |
| Breakdown voltage (kV/mm) | >5 ○ | 0 X | >5 ○ | >5 ○ | 4.0 ○ | >5 ○ | >5 ○ | >5 ○ |
| Insulation stability | ○ | ○ | ○ | ○ | X | ○ | ○ | ○ |
| Handleability | ○/○ | ○/○ | ○/○ | ○/X | ○/○ | ○/○ | ○/○ | X/X |
| Comprehensive evaluation | ◎ | X | ◎ | Δ | Δ | ◎ | ◎ | Δ |

TABLE 4

|  | Thermally conductive sheet 9 | Thermally conductive sheet 10 | Thermally conductive sheet 11 | Thermally conductive sheet 12 | Thermally conductive sheet 13 | Thermally conductive sheet 14 | Thermally conductive sheet 15 |
|---|---|---|---|---|---|---|---|
| Carbon fiber oriented thermally conductive layer No. | 1 | 1 | 2 | 2 | 2 | 1 | 1 |
| Thickness (mm) | 2 | 2 | 2 | 2 | 2 | 2 | 2 |
| E-hardness | 30 | 30 | 30 | 30 | 30 | 30 | 30 |
| Penetration (μm) | 66.3 | 66.3 | 66.3 | 66.3 | 66.3 | 66.3 | 66.3 |
| Thermal conductivity (W/m·K) | 12.9 | 12.9 | 9.9 | 9.9 | 9.9 | 12.9 | 12.9 |
| Electrically insulating thermally conductive layer No. | 6 | 7 | 6 | 7 | 1 | 1 | 1 |
| Thickness (mm) | 0.5 | 0.5 | 0.5 | 0.5 | 0.5 | 0.1 | 0.15 |
| E-hardness | 20 | 40 | 20 | 40 | 40 | 40 | 40 |
| Penetration (μm) | 29.3 | 12.3 | 29.3 | 12.3 | 12.3 | 6.4 | 7.2 |
| Thermal conductivity (W/m·K) | 1.5 | 2.5 | 1.5 | 2.5 | 5.0 | 5.0 | 5.0 |
| Evaluation Thermal conductivity (W/m·K) | 7.6 | 8.4 | 6.4 | 6.7 | 9 | 12.4 | 12.4 |
| Rate of decrease in thermal conductivity (%) | 41.1 X | 34.9 Δ | 35.4 X | 32.3 Δ | 9.1 ○ | 3.9 ○ | 3.9 ○ |
| Breakdown voltage (kV/mm) | >5 ○ | >5 ○ | >5 ○ | >5 ○ | >5 ○ | 1.5 X | 3.0 ○ |
| Insulation stability | ○ | ○ | ○ | ○ | ○ | ○ | ○ |
| Handleability | ○/○ | ○/○ | ○/○ | ○/○ | ○/○ | ○/○ | ○/○ |
| Comprehensive evaluation | Δ | ○ | Δ | ○ | ◎ | X | ◎ |

TABLE 5

|  | Thermally conductive sheet 16 | Thermally conductive sheet 17 | Thermally conductive sheet 18 | Thermally conductive sheet 19 | Thermally conductive sheet 20 | Thermally conductive sheet 21 |
|---|---|---|---|---|---|---|
| Carbon fiber oriented thermally conductive layer No. | 1 | 1 | 1 | 1 | 1 | 1 |
| Thickness (mm) | 2 | 2 | 2 | 2 | 2 | 2 |
| E-hardness | 30 | 30 | 30 | 30 | 30 | 30 |
| Penetration (μm) | 66.3 | 66.3 | 66.3 | 66.3 | 66.3 | 66.3 |
| Thermal conductivity (W/m · K) | 12.9 | 12.9 | 12.9 | 12.9 | 12.9 | 12.9 |
| Electrically insulating thermally conductive layer No. | 6 | 6 | 1 | 1 | None | Polyimide |
| Thickness (mm) | 0.25 | 0.75 | 0.25 | 0.75 | — | 0.050 |
| E-hardness | 20 | 20 | 40 | 40 | — | — |
| Penetration (μm) | 23.1 | 51.4 | 8.6 | 20.9 | — | 0 |
| Thermal conductivity (W/m · K) | 1.5 | 1.5 | 5.0 | 5.0 | — | 0.16 |
| Evaluation Thermal conductivity (W/m · K) | 9.2 | 6.9 | 12.1 | 11.1 | 12.9 | 5.9 |
| Rate of decrease in thermal conductivity (%) | 28.7 Δ | 46.5 X | 6.2 ○ | 14.0 ○ | — | 54.3 X |
| Breakdown voltage (kV/mm) | >5 ○ | >5 ○ | >5 ○ | >5 ○ | 0 X | >5 ○ |
| Insulation stability | ○ | ○ | ○ | ○ | ○ | ○ |
| Handleability | ○/○ | ○/○ | ○/○ | ○/○ | ○/○ | ○/X |
| Comprehensive evaluation | ○ | Δ | ◎ | ◎ | X | X |

Tests for Various Properties:

<Measuring Hardness>

For the carbon fiber oriented thermally conductive layers 1 to 4, the E-hardness of the test piece having a thickness of 10.0 mm was measured with a type E durometer. The results are indicated in Tables 3 to 5. For the electrically insulating thermally conductive layers 1 to 8, the E-hardness of the test piece having a thickness of 10.0 mm was measured with a type E durometer. The results are also indicated in Tables 3 to 5. (Note: the thicknesses of the carbon fiber oriented thermally conductive layers and the electrically insulating thermally conductive layers indicated in Tables 3 to 5 are not 10.0 mm, but the E-hardness is basically not dependent on the thickness and thus the measurement results obtained at a thickness of 10.0 mm are indicated in the tables.)

<Measuring Penetration>

Penetration was measured as another index for hardness in addition to the hardness described above. More specifically, a thermomechanical analyzer (TMA-50 produced by Shimadzu Corporation) equipped with a penetration probe having a cylindrical projection with a diameter of 0.5 mm was used. After each test piece was cut to a length of 10 mm and a width of 10 mm and set to the analyzer, the probe insertion depth at 3 minutes at a loading rate of 1 g/min and a target load of 0.5 g at 23° C. (in other words, the load increased from 0 to 0.5 g in first 30 seconds and remained constant at 0.5 g from 30 seconds to 3 minutes) was measured. The results are indicated in Tables 3 to 5.

Figure 1:
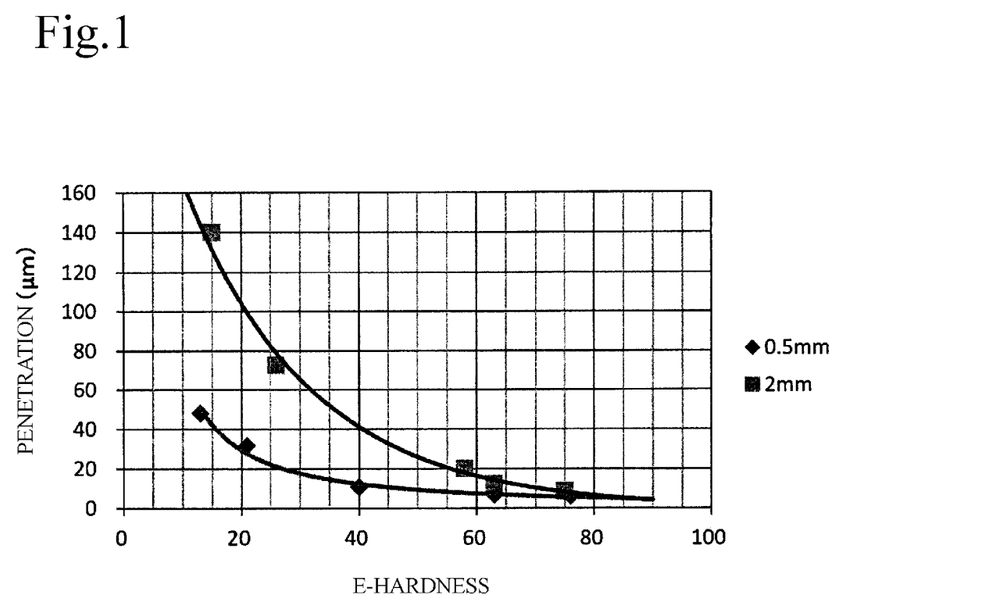
FIG. 1 is a graph indicating the relationship between penetration and E-hardness.

By using some of the results, the observed values of penetration and the values of E-hardness observed from the test pieces having a thickness of 10.0 mm and having the same structure as the test piece for penetration are compared in FIG. 1. More specifically, the values of penetration measured from the test pieces having a thickness of 2 mm and a thickness of 0.5 mm and the values of E-hardness measured from the test pieces having the same structure but a thickness of 10.0 mm were plotted on a graph, and a relational expression (two curves in FIG. 1) for each thickness was yielded from these plots.

As illustrated in FIG. 1, penetration is affected by the thickness of the test piece. However, as long as the relational expression is derived, the E-hardness can be assumed by measuring the penetration of a test piece having a particular thickness and by using this relational expression. In other words, for test pieces having a thickness of 2 mm and a thickness of 0.5 mm, the observed penetrations are substituted into the two relational expressions indicated in FIG. 1 to determine the values of E-hardness. For a thickness other than 2 mm and 0.5 mm, a relational expression relative to a particular length may be established in advance as with these relational expressions so that the E-hardness can be assumed by substituting the observed penetration into the relational expression.

The penetration of the thermally conductive sheet in which the carbon fiber oriented thermally conductive layer and the electrically insulating thermally conductive layer are stacked is an intermediate value between the penetration of the test piece having the same thickness as the thermally conductive sheet but being formed of the carbon fiber oriented thermally conductive layer alone and the penetration of the test piece having the same thickness as the thermally conductive sheet but being formed of the electrically insulating thermally conductive layer alone.

This intermediate value differs depending on whether the penetration is measured from the carbon fiber oriented thermally conductive layer side or the penetration is measured from the electrically insulating thermally conductive layer side. If the electrically insulating thermally conductive layer is harder than the carbon fiber oriented thermally conductive layer, the penetration measured from the electrically insulating thermally conductive layer side is lower (harder).

In view of these findings combined, it can be understood that when penetration is measured from a front surface and a back surface of a test piece having a thickness of L mm and the penetration is A μm from the front surface side and is B μm from the back surface side with A>B, the layer on the front surface side is a layer having an E-hardness softer than the E-hardness converted from the penetration based on the assumption that the thickness is L mm from FIG. 1, and the layer on the back surface side is a layer having an E-hardness harder than the E-hardness converted from the penetration based on the assumption that the thickness is L mm from FIG. 1.

<Measuring Thermal Resistance Value and Calculating Thermal Conductivity>

A test piece cut to a length of 10 mm and a width of 10 mm was interposed between a heat generating substrate (heat quantity Q: 25 W) and a heat sink ("FH60-30" produced by Alpha Company Ltd.), and a particular load (2 kgf/cm$^2$) was applied to the heat sink. A cooling fan (air volume: 0.01 kg/sec, air pressure: 49 Pa) was installed above the heat sink, and a temperature sensor was connected to the heat sink and the heat generating substrate. While operating the cooling fan, electricity was supplied to the heat generating substrate. Five minutes after the supply of electricity was started, the temperature (T1) of the heat generating substrate and the temperature (T2) of the heat sink were measured, and the temperatures were substituted into the following formula (2) to calculate the thermal resistance value of each test piece:

Thermal resistance value (° C./W)=(T1−T2)/heat quantity Q    formula (2)

The thermal resistance value was converted to a thermal conductivity by the following formula (3):

Thermal resistance value (° C./W)=thickness in heat path direction (m)/(heat path sectional area (m$^2$)×thermal conductivity (W/m·K))    formula (3)

The values of the thermal conductivity obtained as above are indicated in Tables 3 to 5.

<Measuring Breakdown Voltage>

The breakdown voltage, which is an index for evaluation of the electrical insulating property, was measured. A test piece was interposed between two electrodes, and the voltage was gradually increased while a load of 200 g was applied. At some point, the electric current sharply rises, a portion of the test piece melts to bear holes or becomes carbonized, and the test piece starts to conduct electricity. The voltage at this point is the breakdown voltage. More specifically, the breakdown voltage was measured with a withstanding voltage tester (TOS8650 produced by KIKUSUI ELECTRONICS CORPORATION) in accordance with JIS K 6249. Five test pieces were prepared for each, and test was conducted five times. The average obtained from five times of testing is indicated in Tables 3 to 5.

<Test for Adhesiveness>

The adhesiveness of the surface of the thermally conductive sheet was tested. A test piece of the thermally conductive sheet cut to a length of 10 mm and a width of 10 mm was placed on a horizontally arranged stainless steel plate, and a weight of 200 g was placed thereon for 10 seconds with a releasing film therebetween so that the thermally conductive sheet was pressed against the stainless steel plate. Subsequently, the stainless steel plate was turned 180° and whether the test piece detached and fell in 10 seconds was tested. A No. 2B finish stainless steel plate was used as the stainless steel plate. The thermally conductive sheet was placed on the stainless steel plate in two ways, namely, with the carbon fiber oriented thermally conductive layer side facing the plate and with the electrically insulating thermally conductive layer side facing the plate. The test was conducted in both ways. Tables 3 to 5 indicate the evaluation results in the order of the carbon fiber oriented thermally conductive layer side facing the stainless steel plate/the electrically insulating thermally conductive layer side facing the stainless steel plate.

Evaluation of Various Properties:

<Hardness>

The thermally conductive sheets 1 to 6 in which an electrically insulating thermally conductive layer with a varying hardness was stacked on a carbon fiber oriented thermally conductive layer with a hardness of E30 were compared. The thermally conductive sheet 2 in which the softest electrically insulating thermally conductive layer with a hardness of E10 was stacked rated best for the thermal conductivity but its breakdown voltage was 0 kV/mm and the desired electrical insulating property was lacking. The thermally conductive sheet 5 in which an electrically insulating thermally conductive layer with a hardness of E18 was stacked had an average breakdown voltage of 4 kV/mm, but in one out of five tests, the measurement result was 0 kV/mm. The thermally conductive sheets 1, 3, 4, and 6 in which the electrically insulating thermally conductive layers having a hardness of E25, E40, E70, and E80, respectively, were stacked had a breakdown voltage exceeding 5 kV/mm. These results show that there was a tendency in which the thermal conductivity increases as the electrically insulating thermally conductive layer becomes softer.

The thermally conductive sheets 7 and 8, in which electrically insulating thermally conductive layers of various values of hardness were respectively stacked on the carbon fiber oriented thermally conductive layers having hardness changed to E60 and E75, are studied next. The thermally conductive sheets 7 and 8 had a breakdown voltage exceeding 5 kV/mm. As for the thermal conductivity, the thermal conductivity of the thermally conductive sheet 8 was slightly lower.

The thermally conductive sheet 2 that did not have the desired breakdown voltage involves a combination of the carbon fiber oriented thermally conductive layer and the electrically insulating thermally conductive layer softer than the carbon fiber oriented thermally conductive layer. Observation of the test piece compressed between the electrodes revealed that the electrically insulating thermally conductive layer overflowed and protruded from the periphery. This shows that the electrical insulating property is degraded when the electrically insulating thermally conductive layer is softer than the carbon fiber oriented thermally conductive layer because the electrically insulating thermally conductive layer is excessively compressed during compression.

The reason that the measurement result was 0 kV/mm just once out of N=5 for the thermally conductive sheet 5 is probably degradation of the electrical insulating property caused by cracking and the like of the electrically insulating thermally conductive layer by compression. The hardness of the electrically insulating thermally conductive layer was as low as E18 although the electrically insulating thermally conductive layer was slightly harder than the carbon fiber oriented thermally conductive layer, and thus the thermally conductive sheet had low strength and was brittle.

Since the thermally conductive sheet 8 in which the hardness of the carbon fiber oriented thermally conductive layer was E75 and the thermally conductive sheet 4 in which the hardness of the electrically insulating thermally conductive layer was E80 showed a tendency of decreasing thermal conductivity, it can be understood that the hardness of the carbon fiber oriented thermally conductive layer is preferably E60 or less and the hardness of the electrically insulating thermally conductive layer is preferably E70 or less.

<Thermal Conductivity>

The thermally conductive sheets 1 and 9 to 13 in which carbon fiber oriented thermally conductive layers and electrically insulating thermally conductive layers with various thermal conductivities were combined were compared. The thermally conductive sheets 1, 9, and 10 were each a thermally conductive sheet in which an electrically insulating thermally conductive layer having a thermal conductivity of 5.0 W/m·K, 1.5 W/m·K, or 2.5 W/m·K was stacked on a carbon fiber oriented thermally conductive layer having a thermal conductivity of 12.9 W/m·K. The thermally conductive sheet 1 in which an electrically insulating thermally conductive layer having a thermal conductivity of 5.0 W/m·K was stacked not only had a high thermal conductivity but also a small decrease in thermal conductivity caused by stacking the electrically insulating thermally conductive layer; this indicates that the thermal conductivity thereof was very close to that of the carbon fiber oriented thermally conductive layer. The same held true for the thermally conductive sheets 11 to 13 each in which the electrically insulating thermally conductive layer having a thermal conductivity of 1.5 W/m·K, 2.5 W/m·K, or 5.0 W/m·K was each stacked on a carbon fiber oriented thermally conductive layer having a thermal conductivity of 11.5 W/m·K.

<Thickness of Electrically Insulating Thermally Conductive Layer>

In the thermally conductive sheets 14 and 15, electrically insulating thermally conductive layers 0.10 mm and 0.15 mm in thickness were respectively stacked. The thermally conductive sheet 15 in which the electrically insulating thermally conductive layer had a thickness of 0.15 mm had a breakdown voltage of 3.0 kV/mm, but the thermally conductive sheet 14 in which this thickness was 0.10 mm had a breakdown voltage decreased to 1.5 kV/mm. This shows that the thickness of the electrically insulating thermally conductive layer is preferably 0.15 mm or more.

<Relationship Between Thermal Conductivity and Thickness of Electrically Insulating Thermally Conductive Layer>

The thermally conductive sheets 16 to 19, 1, and 9 were each a thermally conductive sheet in which an electrically insulating thermally conductive layer having a thermal conductivity of 1.5 W/m·K or 5.0 W/m·K with a varying thickness of 0.25 mm, 0.50 mm, or 0.75 mm was stacked on a carbon fiber oriented thermally conductive layer having a thermal conductivity of 12.9 W/m·K and a thickness of 2 mm.

Figure 2:
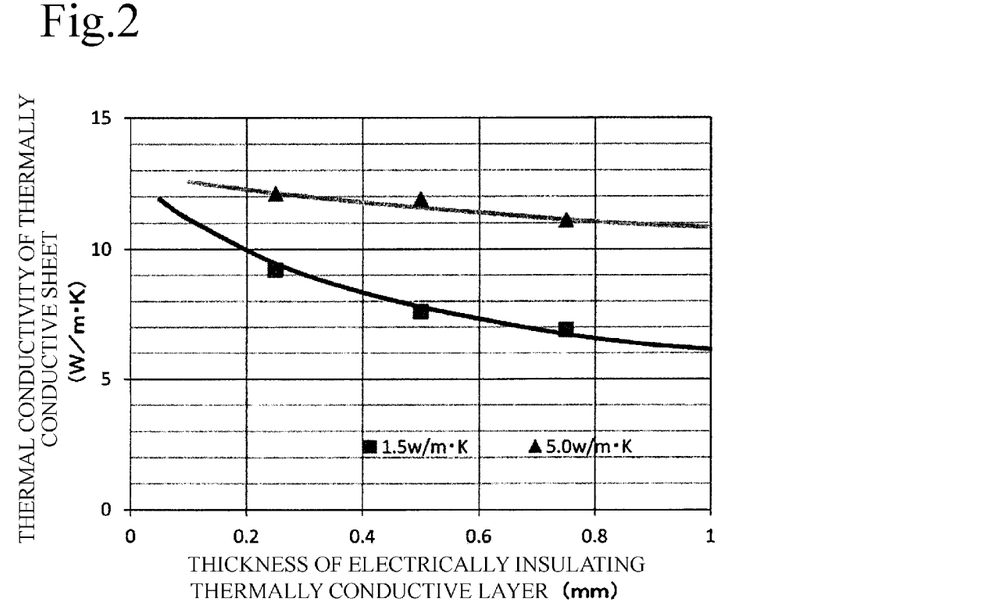
FIG. 2 is a graph indicating the relationship between the thermal conductivity of the thermally conductive sheet and the thickness of the electrically insulating thermally conductive layer.

The graph in which the thicknesses of these electrically insulating thermally conductive layer were plotted along the x axis and the thermal conductivities of the thermally conductive sheets were plotted along the y axis is shown in FIG. 2.

Based on the plots of FIG. 2, the "(1) thickness at which the thermal conductivity of the thermally conductive sheet including an electrically insulating thermally conductive layer having a thermal conductivity of 1.5 W/m·K stacked therein reaches 11.0 W/m·K" and the "(2) the thickness at which the thermal conductivity of the thermally conductive sheet including an electrically insulating thermally conductive layer having a thermal conductivity of 5.0 W/m·K stacked therein reaches 11.0 W/m·K" were determined. As a result, (1) was 0.11 mm and (2) was 0.84 mm.

Figure 3:
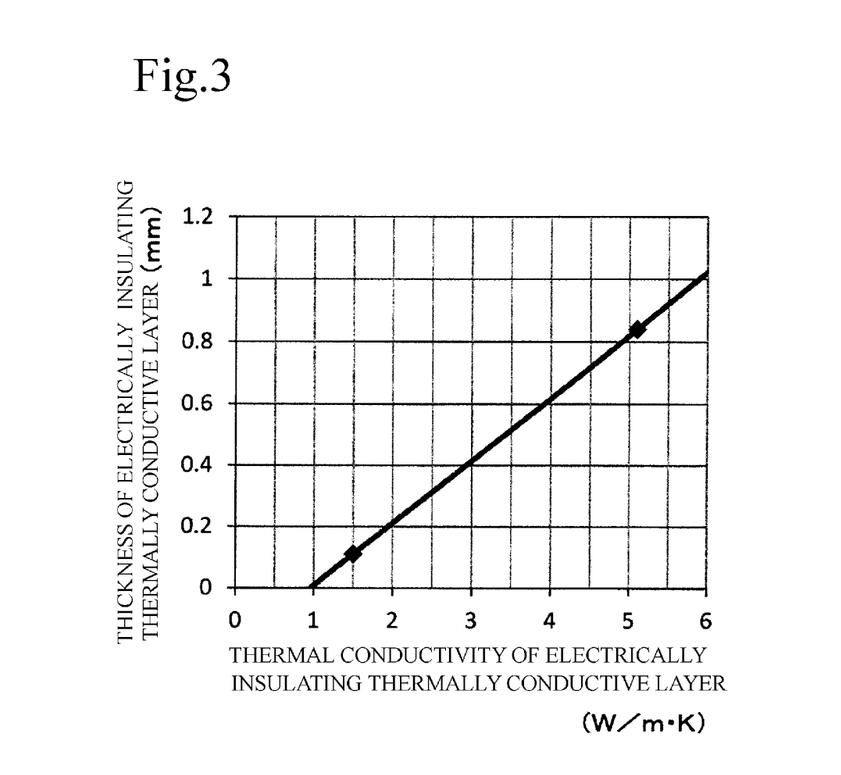
FIG. 3 is a graph indicating the correlation between the thickness and the thermal conductivity of the electrically insulating thermally conductive layer.

Next, a graph in which the thermal conductivity of the electrically insulating thermally conductive layer is plotted along the x axis and the thickness of the electrically insulating thermally conductive layer at which the thermal conductivity of the thermally conductive sheet reaches 11.0 W/m·K is plotted along the y axis is shown in FIG. 3.

From FIG. 3, an approximation formula, y=0.20x−0.19, could be derived.

Then from this formula, the following formula (1) representing the relationship between the thermal conductivity $W(x)$ (unit: W/m·K) and the thickness $T(y)$ (unit: mm) of the electrically insulating thermally conductive layer for obtaining a thermally conductive sheet having a thermal conductivity of 11.0 W/m·K or more was derived:

$$0 < T \leq 0.20\,W - 0.19 \quad \text{formula (1)}$$

<Breakdown Voltage>

Samples with a breakdown voltage of 3 kV/mm were rated "○", and samples with a breakdown voltage less than 3 kV/mm were rated "x". The results are also indicated in Tables 3 to 5.

<Electrical Insulation Stability>

The magnitude of variation in measurement results in the breakdown voltage measurement was evaluated. More specifically, samples with an average value exceeding 3 kV/mm but exhibited a breakdown voltage of 0 kV/mm in one or more test among five tests were rated "x", and other samples were rated "○".

<Rate of Decrease in Thermal Conductivity>

The rate of decrease in thermal conductivity caused by stacking an electrically insulating thermally conductive layer having a lower thermal conductivity than a carbon fiber oriented thermally conductive layer on the carbon fiber oriented thermally conductive layer having a high thermal conductivity was evaluated. In other words, as indicated by the following formula (4), the thermal conductivity of the thermally conductive sheet was subtracted from the thermal conductivity of the carbon fiber oriented thermally conductive layer, and the result was divided by the thermal conductivity of the carbon fiber oriented thermally conductive layer. The obtained result was defined as the rate of decrease in thermal conductivity of the thermally conductive sheet relative to the carbon fiber oriented thermally conductive layer (hereinafter this rate is simply referred to as the "rate of decrease in thermal conductivity"):

$$\text{Rate of decrease in thermal conductivity} = (\text{thermal conductivity of carbon fiber oriented thermally conductive layer} - \text{thermal conductivity of thermally conductive sheet}) / \text{thermal conductivity of carbon fiber oriented thermally conductive layer} \quad \text{formula (4)}$$

The values of the rate of decrease in thermal conductivity obtained as such are indicated in Tables 3 to 5. Samples with a value less than 15% were rated "○" since the decrease in thermal conductivity was small compared to when the carbon fiber oriented thermally conductive layer was used alone and since the adverse effect of providing of the electrically insulating thermally conductive layer could be suppressed. Samples with a value of 15% or more and less than 35% were rated "Δ" since the adverse effect of providing the electrically insulating thermally conductive layer was moderately suppressed. Samples with a value of 35% or more were rated "x" since the decrease in thermal conductivity was significant compared to when the carbon fiber oriented thermally conductive layer was used alone. These results are also indicated in Tables 3 to 5.

<Handleability (Adhesiveness)>

When the thermally conductive sheet has an adhesive surface, it can be fixed to an object to be attached, and the work needed to install the thermally conductive sheet to an electronic device is facilitated. Thus, whether the thermally conductive sheet can be fixed to the object to be attached was evaluated from the viewpoint of handleability. In the test for adhesiveness mentioned above, the test pieces of the thermally conductive sheets that detached and fell off within 10 seconds were assumed to have poor handleability and were rated "x". Those test pieces that did not fall off were rated "○".

As indicated by the results of the handleability test in Tables 3 to 5, the electrically insulating thermally conductive layer side of the thermally conductive sheet 3 was rated "Δ" and evaluated as having fair handleability, and the electrically insulating thermally conductive layer side of the thermally conductive sheet 4 was rated "x" and did not stay fixed to the object to be attached. This shows that the hardness of the electrically insulating thermally conductive layer is preferably E70 or less. The evaluation results of the handleability of the thermally conductive sheets 7 and 8 show that the thermally conductive sheet 7 in which the hardness was E60 was rated fair on the carbon fiber oriented thermally conductive layer side and that the thermally conductive sheet 8 in which the hardness was E75 did not stay fixed to the object to be attached. This shows that the hardness of the carbon fiber oriented thermally conductive layer is preferably E70 or less.

<Comprehensive Evaluation of Thermal Conductivity and Electrical Insulating Property>

Each of the thermally conductive sheets was given a comprehensive evaluation by overviewing the evaluation results from various aspects described above. The thermally conductive sheets 2, 14, and 20 that had completely no electrical insulating property (breakdown voltage was rated x) and the thermally conductive sheet 21 which was rated x for the rate of decrease in thermal conductivity and handleability were given a comprehensive evaluation of x. The thermally conductive sheets that were not rated x in any of the evaluation items were rated "⊚". The thermally conductive sheets that had at least one Δ in the evaluation were rated "○". The thermally conductive sheets that had at least one x for evaluation items other than the breakdown voltage were rated "Δ". This comprehensive evaluation is also shown in Tables 3 to 5.

In view of the above, compared to a thermally conductive sheet in which a resin film with poor handleability and a high rate of decrease in electrical insulating property or thermal conductivity is used, a thermally conductive sheet in which a carbon fiber oriented thermally conductive layer and an electrically insulating thermally conductive layer are stacked is not inferior in terms of two or more of these properties. A thermally conductive sheet that has a particular hardness, thickness, thermal conductivity, etc., is also a thermally conductive sheet that has excellent handleability and heat conducting property.

The invention claimed is:

1. A thermally conductive sheet obtained by stacking a carbon fiber oriented thermally conductive layer and an electrically insulating thermally conductive layer,
   the carbon fiber oriented thermally conductive layer containing a carbon fiber powder, which has a fiber axis oriented in a sheet thickness direction and is contained in a polymer matrix,
   the electrically insulating thermally conductive layer having a heat conducting property and an electrical insulation property and containing an electrically insulating thermally conductive filler dispersed in a polymer matrix, and
   wherein a thermal conductivity (W) (unit: W/m·K) and a thickness (T) (unit: mm) of the electrically insulating thermally conductive layer satisfy a relationship represented by formula (1) below:

$$0 < T \leq 0.20\ W - 0.19 \qquad \text{formula (1).}$$

2. The thermally conductive sheet according to claim 1, wherein the polymer matrix is formed of a cured body of a main agent and a curing agent of a liquid silicone.

3. The thermally conductive sheet according to claim 1, wherein an E-hardness of the carbon fiber oriented thermally conductive layer measured with a type E durometer in accordance with Japanese Industrial Standards, JIS K 6253, is 5 to 60, and
   the electrically insulating thermally conductive layer is harder than the carbon fiber oriented thermally conductive layer, has an E-hardness of 70 or less, and has a thickness of 0.15 to 1.5 mm.

4. The thermally conductive sheet according to claim 1, wherein a thermal conductivity of the carbon fiber oriented thermally conductive layer in the sheet thickness direction is 7 W/m·K or more and 30 W/m·K or less, a thermal conductivity of the electrically insulating thermally conductive layer is 2 W/m·K or more and less than 7 W/m·K, and the thermal conductivity of the carbon fiber oriented thermally conductive layer in the thickness direction is set to be higher than the thermal conductivity of the electrically insulating thermally conductive layer.

5. The thermally conductive sheet according to claim 1, wherein the electrically insulating thermally conductive layer is thinner the carbon fiber oriented thermally conductive layer.

6. The thermally conductive sheet according to claim 1, wherein a thermal conductivity of the electrically insulating thermally conductive layer is 5 W/m·K or more.

7. The thermally conductive sheet according claim 1, wherein the electrically insulating thermally conductive layer has a hardness of 20 or more in terms of E-hardness.

8. The thermally conductive sheet according to claim 1, wherein the carbon fiber oriented thermally conductive layer contains a thermally conductive filler having an aspect ratio of 2 or less.

9. The thermally conductive sheet according to claim 1, wherein the electrically insulating thermally conductive layer is made of only one single sheet.

10. The thermally conductive sheet according to claim 1, wherein the electrically insulating thermally conductive layer is formed by curing a mixed composition in which an electrically insulating thermally conductive filler is blended to a liquid polymer composition that forms a polymer matrix.

* * * * *